US012769214B2

(12) United States Patent
Trancho et al.

(10) Patent No.: US 12,769,214 B2
(45) Date of Patent: Oct. 20, 2026

(54) OPTICAL APPARATUS AND LITHOGRAPHIC APPARATUS USING THE OPTICAL APPARATUS

(71) Applicant: ASML HOLDING N.V., Veldhoven (NL)

(72) Inventors: Joe Trancho, New York, NY (US); William Pierce Chapin, Cos Cob, CT (US); Ryan Richard Westover, Danbury, CT (US); Gerald W. Mcdoom, West Haven, CT (US); Edward Horton, Danbury, CT (US)

(73) Assignee: ASML HOLDING N.V., Veldhoven (NL)

( * ) Notice: Subject to any disclaimer, the term of this patent is extended or adjusted under 35 U.S.C. 154(b) by 918 days.

(21) Appl. No.: 17/910,933

(22) PCT Filed: Mar. 16, 2021

(86) PCT No.: PCT/EP2021/056715
§ 371 (c)(1),
(2) Date: Sep. 12, 2022

(87) PCT Pub. No.: WO2021/191005
PCT Pub. Date: Sep. 30, 2021

(65) Prior Publication Data

US 2023/0185204 A1 Jun. 15, 2023

Related U.S. Application Data

(60) Provisional application No. 63/000,587, filed on Mar. 27, 2020.

(51) Int. Cl.
*G03F 7/00* (2006.01)
*G03F 9/00* (2006.01)

(52) U.S. Cl.
CPC ...... *G03F 7/70633* (2013.01); *G03F 7/70825* (2013.01); *G03F 9/7046* (2013.01)

(58) Field of Classification Search
CPC ............ G03F 7/70616; G03F 7/70633; G03F 7/70825; G03F 7/70966; G03F 7/0002; G03F 9/7046
See application file for complete search history.

(56) References Cited

U.S. PATENT DOCUMENTS 5,229,872 A 7/1993 Mumola
5,296,891 A 3/1994 Vogt et al.
(Continued)

FOREIGN PATENT DOCUMENTS

CN 1475028 2/2004
WO 2019086198 5/2019

OTHER PUBLICATIONS

Office Action issued in corresponding Chinese Patent Application No. 202180022850, dated Mar. 19, 2025.
(Continued)

*Primary Examiner* — David J Makiya
*Assistant Examiner* — Miya Downing
(74) *Attorney, Agent, or Firm* — Pillsbury Winthrop Shaw Pittman, LLP

(57) ABSTRACT

An optical apparatus and a lithographic apparatus including the optical apparatus. The optical apparatus includes a substrate having an aperture for passing light; a transmissive optical element covering the aperture of the substrate; and an optical contact bond between the substrate and transmissive optical element, the optical contact bond being spaced from the aperture a sufficient distance such that stress forces in the transmissive optical element from the optical contact bond to the aperture are below an acceptable stress threshold. The optical contact bond geometry herein, for example, mini-
(Continued)

mizes a contact area and provides a quasi-kinematic (near-exactly constrained) interface between the substrate and the optical element.

20 Claims, 9 Drawing Sheets

(56) References Cited

U.S. PATENT DOCUMENTS

| | | | | |
|---|---|---|---|---|
| 5,523,193 | A | 6/1996 | Nelson | |
| 5,969,441 | A | 10/1999 | Loopstra et al. | |
| 6,046,792 | A | 4/2000 | Van Der Werf et al. | |
| 8,384,749 | B2 * | 2/2013 | Morooka | B41J 2/33585 347/202 |
| 11,415,893 | B2 * | 8/2022 | Roux | G03F 7/7015 |
| 2008/0002170 | A1 * | 1/2008 | Gellrich | G03F 7/70808 359/896 |
| 2009/0157360 | A1 | 6/2009 | Ye et al. | |
| 2010/0272964 | A1 * | 10/2010 | Traggis | C04B 37/005 428/411.1 |

OTHER PUBLICATIONS

International Search Report and Written Opinion issued in corresponding PCT Patent Application No. PCT/EP2021/056715, dated Jul. 1, 2021.

J. Burnett, Z. H. Levine, and E. Shipley, “Intrinsic Birefringence in 157 nm materials,” Proc. 2nd Intl. Symp on 157 nm Lithography, Austin, Intl SEMATEC, ed. R. Harbison (2001).

* cited by examiner

OPTICAL APPARATUS AND LITHOGRAPHIC APPARATUS USING THE OPTICAL APPARATUS

CROSS-REFERENCE TO RELATED APPLICATIONS

This application is the U.S. national phase entry of PCT Patent Application No. PCT/EP2021/056715 which was filed on Mar. 16, 2021, which claims priority of U.S. Provisional Patent Application No. 63/000,587, which was filed on Mar. 27, 2020, and which is incorporated herein in its entirety by reference.

TECHNICAL FIELD

The present disclosure relates to an optical apparatus. For example, the optical apparatus can be used in a lithographic apparatus or a metrology apparatus to improve optics based measurements.

BACKGROUND

A lithographic projection apparatus can be used, for example, in the manufacture of integrated circuits (ICs). In such a case, a patterning device (e.g., a mask) may contain or provide a circuit pattern corresponding to an individual layer of the IC ("design layout"), and this circuit pattern can be transferred onto a target portion (e.g. comprising one or more dies) on a substrate (e.g., silicon wafer) that has been coated with a layer of radiation-sensitive material ("resist"), by methods such as irradiating the target portion through the circuit pattern on the patterning device. In general, a single substrate contains a plurality of adjacent target portions to which the circuit pattern is transferred successively by the lithographic projection apparatus, one target portion at a time. In one type of lithographic projection apparatuses, the circuit pattern on the entire patterning device is transferred onto one target portion in one go; such an apparatus is commonly referred to as a wafer stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the circuit pattern on the patterning device are transferred to one target portion progressively. Since, in general, the lithographic projection apparatus will have a magnification factor M (generally <1), the speed F at which the substrate is moved will be a factor M times that at which the projection beam scans the patterning device. More information with regard to lithographic devices as described herein can be gleaned, for example, from U.S. Pat. No. 6,046,792, incorporated herein by reference.

As noted, microlithography is a central step in the manufacturing of ICs, where patterns formed on substrates define functional elements of the ICs, such as microprocessors, memory chips etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula $CD=k_1\times\lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. It follows from CD equation that reduction of the minimum printable size of features can be obtained in three ways: by shortening the exposure wavelength $\lambda$, by increasing the numerical aperture NA, or by decreasing the value of k1.

To shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm, for example within the range of 5-10 nm such as 6.7 nm or 6.8 nm. Possible sources include, for example, laser-produced plasma sources, discharge plasma sources, or sources based on synchrotron radiation provided by an electron storage ring.

In an embodiment, a high light transmissivity through an optical reduction system with little or no loss may be desired. For example, high light transmissivity is desired in UV lithography applications or a lithographic apparatus sub-system. In one aspect, an exposure time and an overall semiconductor fabrication time depends upon the intensity or magnitude of light output onto a wafer. An optical reduction system (also referred as a projection system) is expected to output a sharp focused image of a mask onto the wafer. Such sharp image ensures that fine details related to a target pattern are preserved.

As the exposure wavelength decreases, the optical reduction system includes optical components, such as, lenses, which are made of a material that is transparent even at low UV wavelengths such as 193 nm and 157 nm. Examples of such optical materials include calcium fluoride (CaF2) and barium fluoride (BaF2). These optical materials, however, have a relatively high degree of intrinsic birefringence (also called spatial-dispersion-induced birefringence). This high intrinsic birefringence is very direction dependent. As a result, the optical characteristics of the optical material (such as transmissivity and refraction) vary unevenly across a beam incident on the optical material. In other words, because of the directional dependence of the intrinsic birefringence, some parts of a beam spot may be sped up or slowed down relative to other parts of the beam spot depending the polarization of light at the different parts of the beam spot. In demanding applications like microlithography, such intrinsic birefringence is undesirable as it can blur or reduce the sharpness of an image, or cause loss of light through an optical reduction system.

One approach to correcting intrinsic birefringence is to use a single pair of optical elements rotated relative to one another. For a single pair of lenses having a <100> crystal orientation, the optical axis of the crystal structure of one lens in the pair is rotated at an angle relative to the optical axis of the crystal structure of other lens. Such correction of intrinsic birefringence is limited, especially in high-quality applications like photolithography.

What is needed is an even superior approach for correcting or reducing the birefringence caused by optical elements. This is especially desired in optical reduction systems used in low UV microlithography applications.

BRIEF SUMMARY

In an embodiment, there is provided an optical apparatus. The optical apparatus includes a substrate having an aperture for passing light; a transmissive optical element covering the aperture of the substrate; and an optical contact bond between the substrate and transmissive optical element. The optical contact bond being spaced from the aperture a sufficient distance such that stress forces in the transmissive optical element from the optical contact bond to the aperture are below an acceptable stress threshold.

Furthermore, in an embodiment, there is provided a metrology apparatus for measuring a characteristic of an object. The metrology apparatus includes a light source; and an optical apparatus. The optical apparatus includes a substrate having an aperture for passing light; a transmissive optical element covering the aperture of the substrate; and an optical contact bond between the substrate and transmissive optical element. The optical contact bond being spaced from the aperture a sufficient distance such that stress forces in the transmissive optical element from the optical contact bond to the aperture are below an acceptable stress threshold. The light passing through the transmissive optical element generates an interference pattern, which is used to extract a measurement of the characteristic of the object.

Furthermore, in an embodiment, there is provided a lithographic apparatus. The lithographic apparatus includes a light source; and an optical apparatus. The optical apparatus includes a substrate having an aperture for passing light; a transmissive optical element covering the aperture of the substrate; and an optical contact bond between the substrate and transmissive optical element. The optical contact bond being spaced from the aperture a sufficient distance such that stress forces in the transmissive optical element from the optical contact bond to the aperture are below an acceptable stress threshold. The light passing through the transmissive optical element generates an interference pattern, which is used to extract a measurement of a characteristic associated with a patterning process.

BRIEF DESCRIPTION OF THE DRAWINGS

Embodiments will now be described, by way of example only, with reference to the accompanying drawings in which.

Figure 1A:
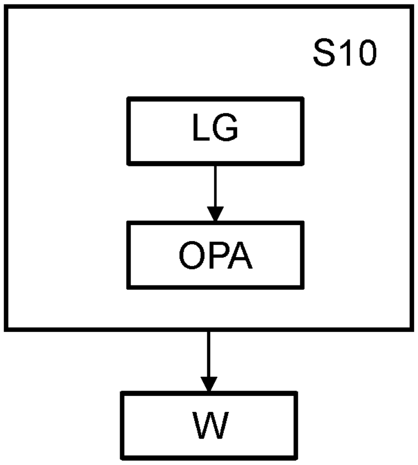
FIG. 1A is block diagram of an example apparatus employing an optical apparatus, according to an embodiment.

Embodiments will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Wherever convenient, the same reference numbers will be used throughout the drawings to refer to same or like parts. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

DETAILED DESCRIPTION

While the present disclosure describes features herein with reference to illustrative embodiments for particular applications, it should be understood that the invention is not limited thereto. Those skilled in the art with access to the teachings provided herein will recognize additional modifications, applications, and embodiments within the scope thereof and additional fields in which the present invention would be of significant utility.

To more clearly delineate the present invention, an effort is made throughout the specification to adhere to the following term definitions consistently.

The term "optical element" refers to any element that can be used in an optical apparatus or an optical system. An optical element can include, but is not limited to, any type of lens, such as, a double convex lens, a plano-convex lens, a convex-plano lens, a double concave lens, a piano-concave lens, a concave-plano lens, shell, or plate.

In one example, the optical element can be made of cubic crystalline materials. The cubic crystalline materials are useful as optical elements in short wavelength optical systems such as wafer steppers and other projection printers used to produce small features on substrates such as semiconductor and other wafers used in the semiconductor manufacturing industry. In particular, calcium fluoride finds particular advantage in that it is an easily obtained cubic crystalline material and large high purity single crystals can be grown.

A primary concern for the use of cubic crystalline materials for optical elements in deep ultraviolet lithography systems is anisotropy of refractive index inherent in cubic crystalline materials; this is referred to as "intrinsic birefringence." It has been recently reported [J. Burnett, Z. H. Levine, and E. Shipley, "Intrinsic Birefringence in 157 nm materials," Proc. 2nd Intl. Symp on 157 nm Lithography, Austin, Intl SEMATEC, ed. R. Harbison, 2001] that cubic crystalline materials such as calcium fluoride, exhibit intrinsic birefringence that scales as the inverse of the square of the wavelength of light used in the optical system. The magnitude of this birefringence becomes especially significant when the optical wavelength is decreased below 250 nanometers and particularly as it approaches 100 nanometers. Of particular interest is the effect of intrinsic birefringence at the wavelength of 157 nanometers (nm), the wavelength of light produced by an F2 excimer laser favored in the semiconductor manufacturing industry.

Birefringence, or double-refraction, is a property of refractive materials in which the index of refraction is anisotropic. For light propagating through a birefringent material, the refractive index varies as a function of polarization and orientation of the material with respect to the propagation direction. Unpolarized light propagating through a birefringent material will generally separate into two beams with orthogonal polarization states.

When light passes through a unit length of a birefringent material, the difference in refractive index for the two ray paths will result in an optical path difference or retardance. Birefringence is a unitless quantity, although it is common practice in the lithography community to express it in units of nm/cm. Birefringence is a material property, while retardance is an optical delay between polarization states. The retardance for a given ray through an optical system may be expressed in nm, or it may be expressed in terms of number of waves of a particular wavelength.

In an embodiment, stress on the optical element creates a spatially varying birefringence and change in optical path difference within the optical system. In an embodiment, such stress-induced birefringence or optical path difference may be undesirable, as it may affect e.g., measurement accuracies or induce measurement errors.

In an embodiment, FIG. 1A is a block diagram of an apparatus S10 employing a lens apparatus OPA according to the present disclosure. In an example, the lens apparatus OPA may be employed in a sensor S10 (e.g., a level sensor used in a lithographic apparatus shown in FIG. 7 and FIG. 8). Such lens assembly OPA may create undesired varying birefringence and change in optical path difference. As mentioned earlier, the birefringence is a property of the optical material that may cause the light LG propagating though the material into two beams causing an optical path difference between the two beams.

Figure 1B:
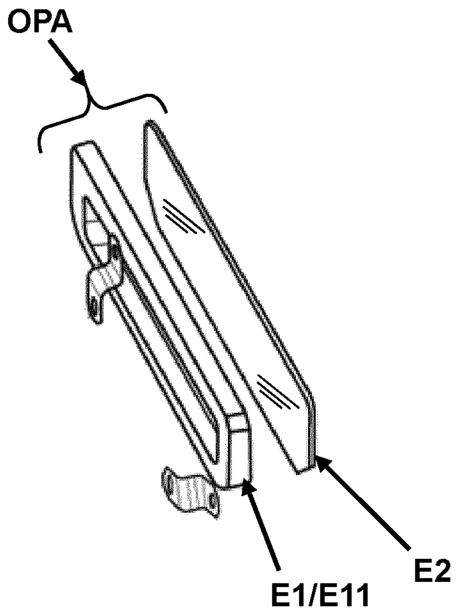
FIG. 1B is an exploded view of the optical apparatus used in FIG. 1A, according to an embodiment.

FIG. 1B illustrates an exploded view of the lens apparatus OPA. The lens apparatus OPA includes a fused silica window E2 (also referred as a transmissive optical element) that employs an optical contact bond. The optical bond may increase stiffness of the fused silica window E2. In an embodiment, the fused silica window E2 may be relative thin e.g., 0.5 mm to attain specified optical properties. As the window may be thin, in an embodiment, a substrate E1 may be used to increase the stiffness of the window E2. The substrate E1 may be an opaque optical element having e.g., thickness of 3.5 mm. The substrate may include an aperture (e.g., rectangular slot).

Figure 2:
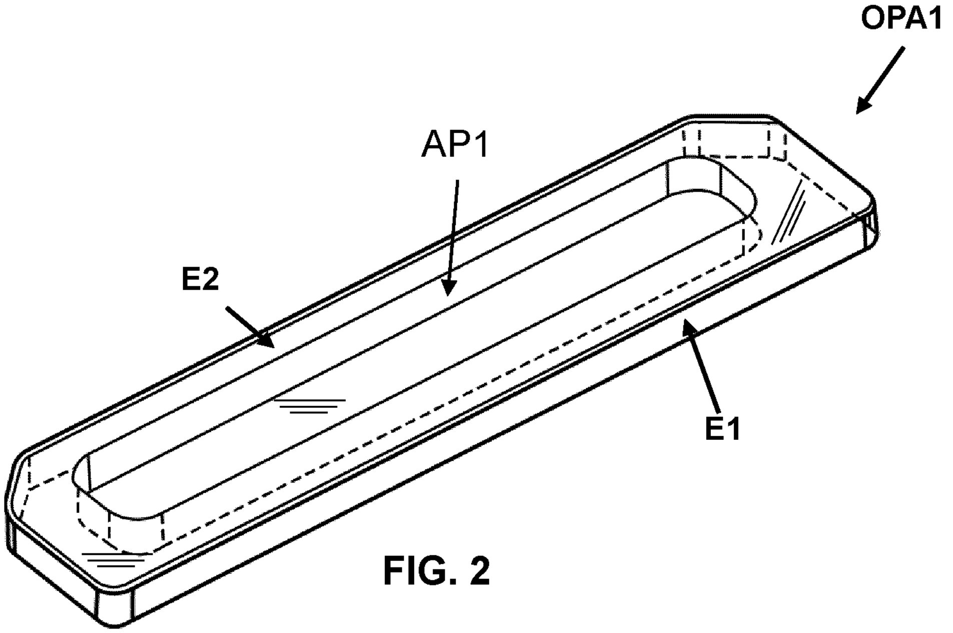
FIG. 2 is an existing optical apparatus, according to an embodiment.

Referring to FIG. 2, the window E2 may be supported by the substrate E1 along its outer edges, i.e., outside of its clear aperture AP1. In the existing optical assembly or the optical apparatus, the optical contact has a large contact areas, e.g., surface contact with an entire substrate's surface. Further, the optical apparatus may be mounted onto a lens system using ceramic pads and spring clips located above the pads.

In an example application, recently, an ultra violet lens sensor (UVLS) has experienced issues at system level qualification for Z-Level Process Dependency (ZLPD). In an embodiment, ZLPD is a polarization-dependent height process dependency (HPD) effect. In an embodiment, the height process dependency effect is the focus difference across UVLS measurement spots caused by a varying thickness of e.g., an oxide layer on a wafer.

In an embodiment, a high birefringence gradient at the window can be correlated to high ZLPD through e.g., statistical analysis. A large birefringence gradient in the window alters the polarization state of the UVLS wavefront differently at different measurement spots. This leads to differing HPD at each measurement spot. An existing window manufacturing and contacting process causes stresses at the window E2 (e.g., at the aperture AP1 of E1) of the optical apparatus OPA1, leading to high birefringence and, therefore, ZLPD.

Some disadvantages of the optical apparatus OPA1 produced by the exiting process of manufacturing are as follows. A high stress in the optical element caused by the bond warping the contacted optical element. The stress from the optical contact reaches regions of the optical element near the aperture AP1 causing a high birefringence effect. Such birefringence effect can be a relatively high optical path difference, which increases measurement error in system employing the optical apparatus (e.g., OPA1). The erroneous measurements may have a negative impact on UVLS yield, as qualification tests (e.g., ZLPD specifications) may not be met. The HPD effects may worse due to increased birefringence or increase OPD caused by the stressed optical element.

Figure 3:
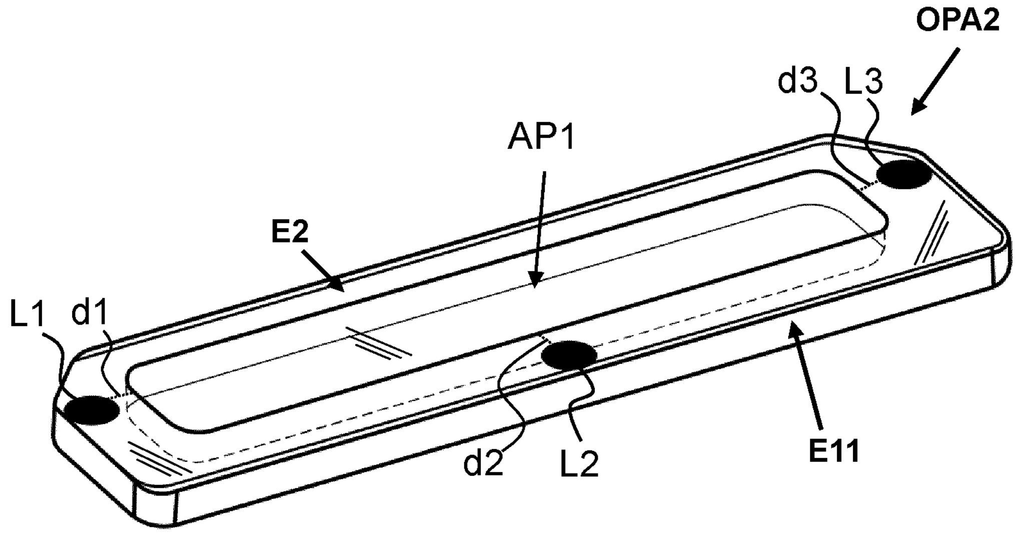
FIG. 3 is an optical apparatus, according to an embodiment.

According to the present disclosure, there is provided an optical apparatus such that the optical bond's contact areas and the stress caused due to the optical contact bond is minimized at the aperture AP1. FIG. 3 illustrates an example of an optical apparatus OPA2, where a transmissive optical element E2 (e.g., a fused silica window) forms an optical contact bond at three specified locations (e.g., L1, L2, and L3). In an embodiment, the placement (e.g., at L1, L2, and L3) of the optical contact bond significantly reduces birefringence in the window at the aperture APL. In an embodiment, the optical contact bond's placement geometry can reduce birefringence in any contacted thin optics. The optical apparatus OPA2 having the optical contact bond's geometric locations L1, L2, and L3 is presented by way of example to describe the features of the present disclosure and does not limit the scope of the present disclosure.

According to an embodiment, an optical apparatus (e.g., OPA2 of FIG. 3) comprises a substrate E11 having an aperture AP1 for passing light; a transmissive optical element E2 covering the aperture AP1 of the substrate E11; and an optical contact bond (e.g., at L1, L2, and L3) between the substrate E11 and the transmissive optical element E2. The optical contact bond (e.g., at L1, L2, and L3) being spaced from the aperture AP1 at a sufficient distance such that stress forces in the transmissive optical element E2 from the optical contact bond to the aperture AP1 are below an acceptable stress threshold. In an embodiment, the acceptable stress threshold is associated with an optical property of the transmissive optical element E2 affected by the stress at the aperture APL.

In an embodiment, the aperture AP1 is a rectangular cut-out (e.g., see FIGS. 1B and 3) in the substrate E11 through which light can pass.

In an embodiment, the optical contact bond (e.g., at L1, L2, and L3) is a glueless bond between two closely conformal surfaces being joined together and being held purely by intermolecular forces. Such bonds are different from bonds created via adhesive, soldering, or other bonds that include additional material between two contacting surfaces. Such additional material or the bonds forming process itself may induce additional stresses in the optical element.

In an embodiment, the optical contact bond (e.g., at L1, L2, and L3) is formed at a selected locations of the substrate E11. A distance of a selected location from the aperture AP1 is a function of stress, caused by the optical contact bond (e.g., at L1, L2, and L3), in the transmissive optical element E2. In an embodiment, one or more locations of the selected locations are spaced farthest from the aperture AP1 such that an amount of stress, caused by the optical contact bond (e.g., at L1, L2, and L3), in the transmissive optical element E2 at the aperture AP1 is minimized.

For example, the distances d1, d2, d3, or a combination thereof, may be selected for forming the optical contact bond such that the stress in the transmissive optical element E2 is minimized. In an embodiment, the distances d1, d2, and d3 can be distances farthest from the aperture AP1.

In an embodiment, the optical contact bond (e.g., at L1, L2, and L3) are spaced from the aperture AP1 such that the transmissive optical element E2 is constrained in six degrees of freedom. In an embodiment, the six degrees of freedom comprises: three translation directions along x-axis, y-axis, and z-axis, respectively, and three rotational directions about x-axis, y-axis, and z-axis, respectively.

In an embodiment, the optical contact bond (e.g., at L1, L2, and L3) at the selected locations minimizes a birefringence effect caused by the light passing through the aperture AP1 and the transmissive optical element E2. In an embodiment, the birefringence effect is an optical path difference (OPD) of the light used to create a topographic map of the substrate E11.

Figure 4A:
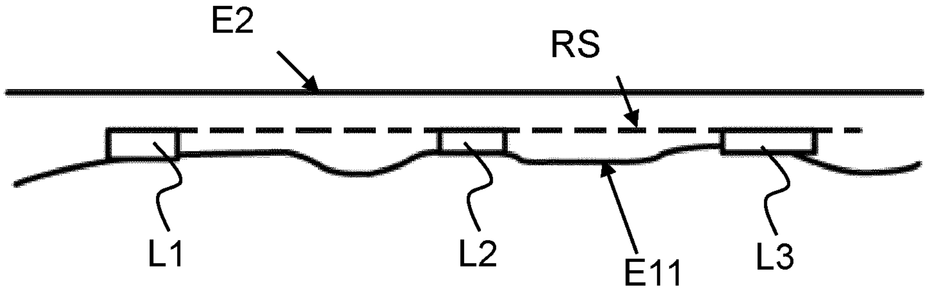
FIG. 4A schematically represents arrangement of elements of the optical apparatus of FIG. 3, according to an embodiment.
Figure 4B:
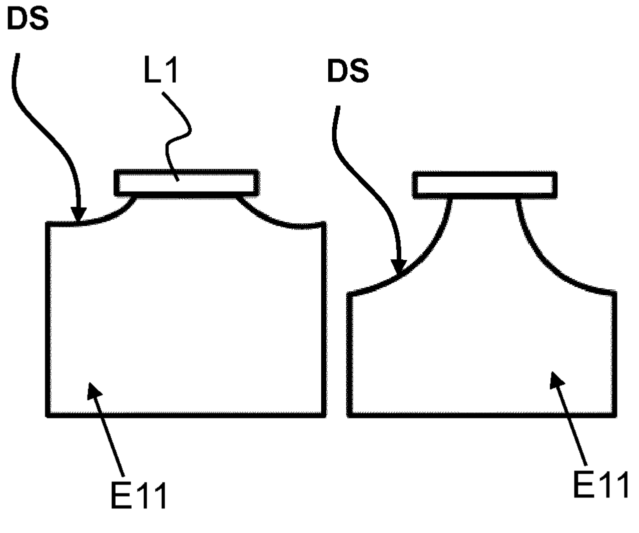
FIG. 4B is a cross-section of the optical apparatus of FIG. 3, according to an embodiment.

In an embodiment, as illustrated in FIGS. 4A and 4B, the selected locations (e.g., L1, L2, and L3) are at least three raised portions of the substrate E11, the raised portions forming a raised surface (e.g., RS). The raised surface RS forming the optical contact bond (e.g., at L1, L2, and L3) with the transmissive optical element E2 and constraining the transmissive optical element E2 in a plane of the raised surface RS.

As shown in FIGS. 4A and 4B, the raised surface RS creates a gap between the transmissive optical element E2 and a depressed surface DS (see FIG. 4B) surrounding the raised surface RS of the substrate E11. The gap prevents the transmissive optical element E2 from creating an optical contact bond (e.g., at L1, L2, and L3) with the depressed surface DS or naturally joining the depressed surface DS of the substrate E11.

In an embodiment, the depressed surface DS of the substrate E11 is relatively rougher than the raised surface RS of the substrate E11. In an embodiment, the depressed surface DS of the substrate E11 is sandblasted. Such depressed surface DS prevents a thin optical element (e.g., E2) from getting sucked in due to a vacuum between the gap. The vacuum may cause the thin optical element E11 to deform and conform to an irregular surface of the substrate E11.

In an embodiment, as shown in FIG. 4B, the depressed surface DS is created by masking the selected locations and acid-etching the substrate E11. Depending on the amount of etching, the gap between the depressed surface DS and raised surface RS will change. For example, higher etching results in higher gap. In an embodiment, masking of the raised surface RS may be performed on a reduced area at the selected locations (e.g., L1, L2, and L3). The masking area of the raised surface is determined such that the stress caused from contacting will be reduced. In an embodiment, the raised surface RS themselves do not inherently have less stress. The reducing of a surface area of the raised surface RS reduces stress caused from the contacting. Also, sub-surface deformations removed on the depressed surface DS also reduces stress in the substrate E11 (pre-contacting). In an embodiment, due to such raised surface RS, less area is available for contamination or contacting error. Acid etch stress-relieves the substrate, but may worsen surface flatness. However, masking of contact areas creates a stress-relieved substrate that can be used for contacting without additional polishing. In an embodiment, using three contact points (e.g., optical bonds at L1, L2, L3) spaced apart also reduces warping of the window surface and enables nearly-exact constraint (i.e., neither under constrained nor over constrained) of the optical element E2.

In an embodiment, a surface roughness of both the transmissive optical element E2 and the substrate E11 is less than 5 nm at portions forming the optical contact bond (e.g., at L1, L2, and L3). In an embodiment, a thickness of the substrate E11 is greater than a thickness of the transmissive optical element E2. For example, the thickness of the substrate E11 is between 1 mm to 4 mm, and the thickness of the transmissive optical element E2 is 0.5 mm or less.

Figure 5A:
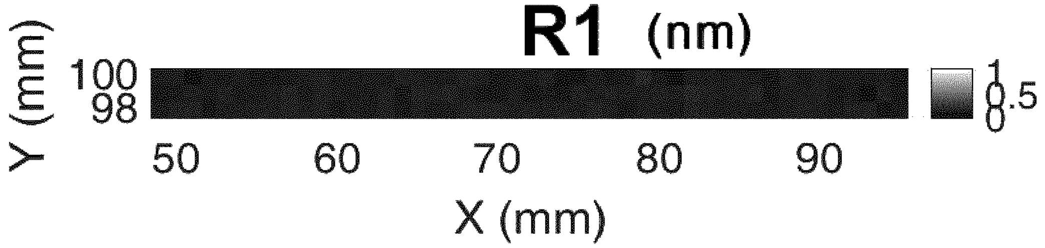
FIG. 5A is an example retardance resulted from uncontacted elements (e.g., optical element not contacted with a substrate) of the optical apparatus, according to an embodiment.
Figure 5B:
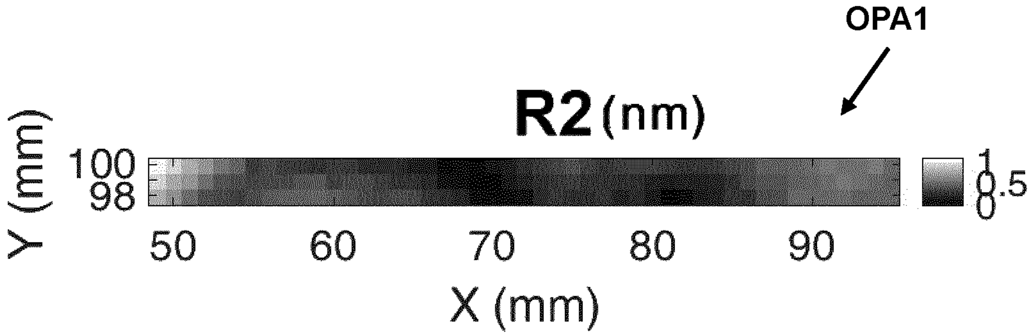
FIG. 5B is an example retardance resulted from an existing optical apparatus (e.g., FIG. 2), according to an embodiment.
Figure 5C:
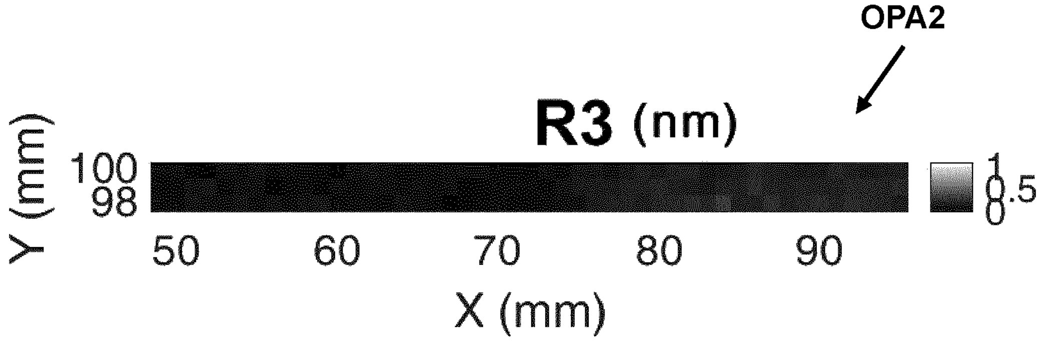
FIG. 5C is an example retardance resulted from the optical apparatus of FIG. 3, according to an embodiment.

FIGS. 5A-5C illustrates example birefringence resulting from different optical apparatus configurations. FIG. 5A is an example retardance R1 (e.g., linear retardance R1) resulted from uncontacted elements (e.g., optical element contacted with a substrate) of the optical apparatus (e.g., OPA1 or OPA2). FIG. 5B is an example retardance R2 (e.g., linear retardance R2) resulted from the existing optical apparatus OPAL. FIG. 5C is an example retardance R3 (e.g., linear retardance R3) resulted from proposed optical apparatus OPA2 (in FIG. 3).

Comparing FIGS. 5A-5C shows that birefringence is improved with lower stress bond (e.g., the optical contact bonds at L1, L2, L3 in FIG. 3). Referring to FIG. 5B, a wavy pattern indicates irregular surface and locked-in stress. FIG. 5C shows, more random pattern is similar to uncontacted window, lower stress and less surface deformation.

Figure 6:
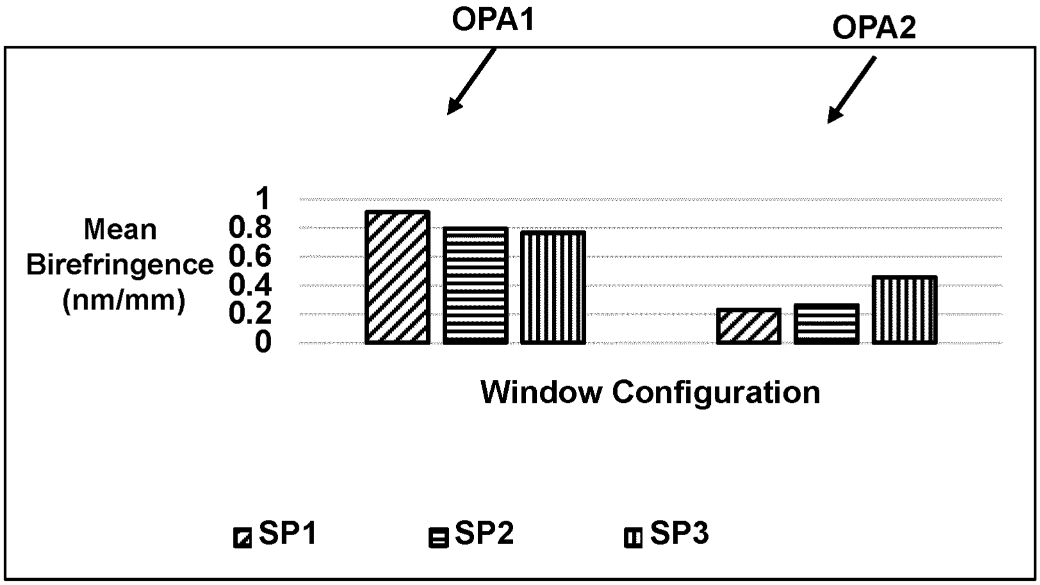
FIG. 6 shows mean birefringence associated with different optical apparatuses, according to an embodiment.

FIG. 6 illustrates birefringence values for showing improvements resulting from proposed optical apparatus OPA2. In an example, when the transmissive optical element (e.g., E2) makes a full surface contact with the substrate (e.g., E1 in FIG. 2). The FIG. 6 shows that each of the three different windows made with finalized process show 61% reduction in mean birefringence with e.g., 3 pad design (e.g., optical bonds at L1, L2, L3). For example, based on three samples SP1, SP2 and SP3, the optical apparatus OPA1 has an average birefringence of 0.823 nm/mm, while the optical apparatus OPA2 has an average birefringence of 0.315 nm/mm.

In an embodiment, there is provided a metrology apparatus (e.g., a level sensor of FIG. 1A incorporating the optical apparatus of FIG. 3) for measuring a characteristic of an object (e.g., a wafer printed via the lithographic apparatus).

In an embodiment, the metrology apparatus includes a light source; and an optical apparatus (e.g., including the optical apparatus OPA2). As discussed herein, the optical apparatus includes a substrate E11 having an aperture for passing light; a transmissive optical element E2 covering the aperture of the substrate E11; and an optical contact bond. The optical contact bond (e.g., at L1, L2, and L3) is formed between the substrate E11 and transmissive optical element E2. The optical contact bond (e.g., at L1, L2, and L3) being spaced from the aperture a sufficient distance such that stress forces in the transmissive optical element E2 from the optical contact bond (e.g., at L1, L2, and L3) to the aperture are below an acceptable stress threshold. In an embodiment, the light passing through the transmissive optical element E2 generates an interference pattern, which is used to extract a measurement of the characteristic of the object.

In an embodiment, the characteristic is a height map of the object measured based on the interference pattern generating via reflecting the light of the object and passing the reflected light through the optical apparatus. In an example, the object is a wafer imaged by a lithographic apparatus. The characteristic of the object is alignment data associated with a pattern printed on the wafer imaged by the lithographic apparatus.

As discussed herein, the optical contact bond (e.g., at L1, L2, and L3) is formed at a selected locations of the substrate E11. A distance of a selected location from the aperture is a function of stress, caused by the optical contact bond (e.g., at L1, L2, and L3), in the transmissive optical element E2.

In an embodiment, one or more locations of the selected locations are spaced farthest from the aperture such that an amount of stress, caused by the optical contact bond (e.g., at L1, L2, and L3), in the transmissive optical element E2 at the aperture is minimized. In an embodiment, the selected locations are at least three raised portions of the substrate E11, the raised portions forming a raised surface RS. The raised surface RS forming the optical contact bond (e.g., at L1, L2, and L3) with the transmissive optical element E2 and constraining the transmissive optical element E2 in a plane of the raised surface RS.

In an embodiment, the raised surface RS creates a gap between the transmissive optical element E2 and a depressed surface DS surrounding the raised surface RS of the substrate E11, the gap preventing the transmissive optical element E2 from creating an optical contact bond (e.g., at L1, L2, and L3) with the depressed surface DS or naturally joining the depressed surface DS of the substrate E11.

In an embodiment, a thickness of the substrate E11 is between 1 mm to 4 mm, and a thickness of the transmissive optical element E2 is 0.5 mm or less.

In an embodiment, the optical contact bond (e.g., at L1, L2, and L3) are spaced from the aperture such that the transmissive optical element E2 is constrained in six degrees of freedom. In an embodiment, the optical contact bond (e.g., at L1, L2, and L3) is formed such that an optical path difference (OPD) of the light used to create a topographic map of the substrate E11.

Figure 7:
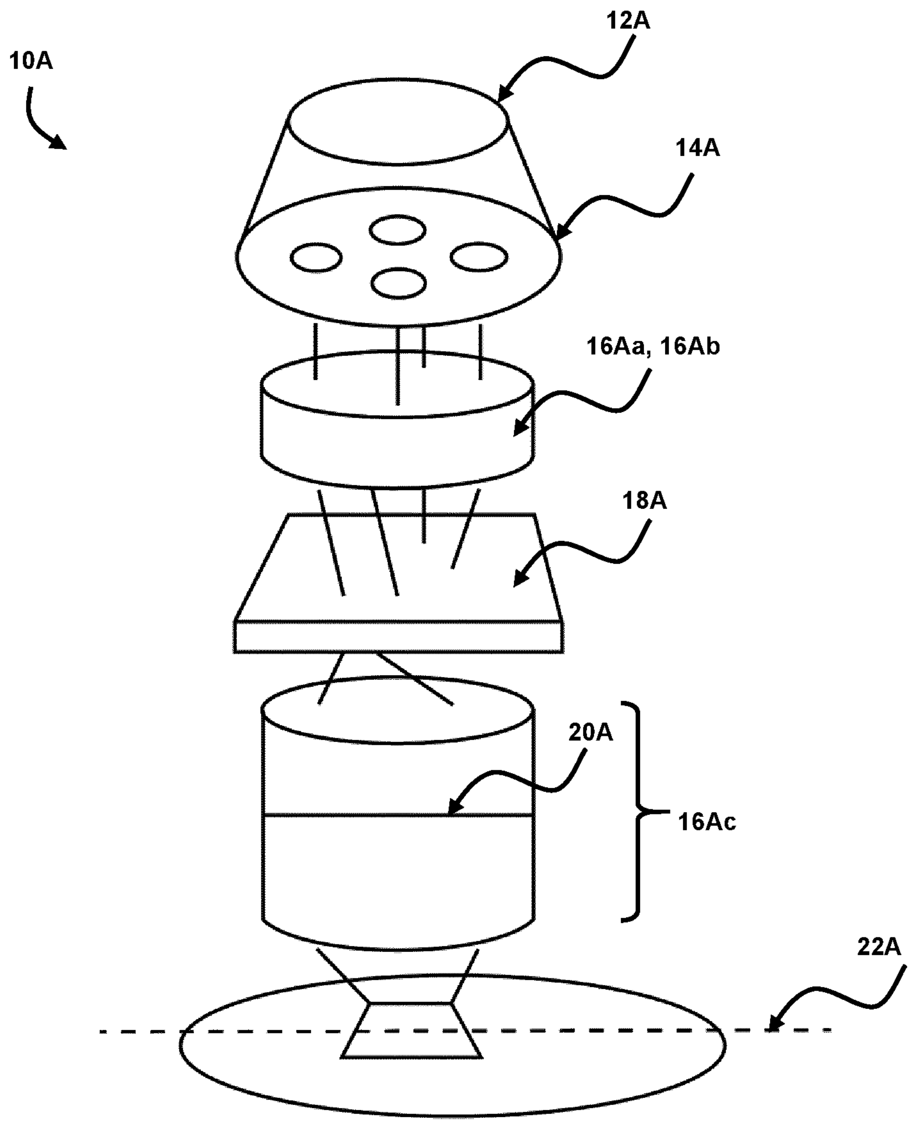
FIG. 7 is a block diagram of various subsystems of a lithography system, according to an embodiment.
Figure 8:
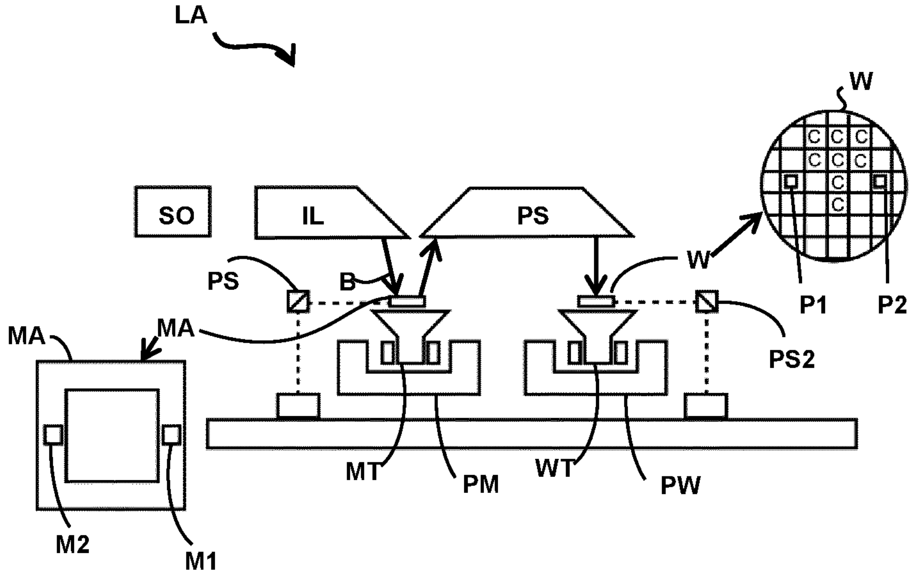
FIG. 8 is a schematic illustration of a reflective lithographic apparatus, according to an embodiment, according to an embodiment.

In an embodiment, the optical apparatus OPA2 can be employed in a lithographic apparatus (e.g., FIG. 7 and FIG. 8). In an embodiment, the lithographic apparatus includes a light source; and an optical apparatus (e.g., OPA2 of FIG. 3). The optical apparatus includes a substrate E11 having an aperture for passing light; a transmissive optical element E2 covering the aperture of the substrate E11; and an optical contact bond. The optical contact bond (e.g., at L1, L2, and L3) is between the substrate E11 and transmissive optical element E2. The optical contact bond (e.g., at L1, L2, and L3) is spaced from the aperture a sufficient distance such that stress forces in the transmissive optical element E2 from the optical contact bond (e.g., at L1, L2, and L3) to the aperture are below an acceptable stress threshold. The light passing through the transmissive optical element E2 generates an interference pattern, which is used to extract a measurement of a characteristic associated with a patterning process.

In an embodiment, the characteristic is a height map of an object being patterned by the lithographic apparatus. The characteristic is derived based on the interference pattern generated by reflecting the light of the object and passing the reflected light through the optical apparatus.

In an embodiment, the characteristic is alignment data. The alignment data is indicative of alignment between patterns on a particular layer or between different layers of the object patterned via the lithographic apparatus.

In an embodiment, the optical contact bond (e.g., at L1, L2, and L3) is formed at a selected locations of the substrate E11. The distance of a selected location from the aperture is a function of stress, caused by the optical contact bond (e.g., at L1, L2, and L3), in the transmissive optical element E2.

In an embodiment, one or more locations of the selected locations are spaced farthest from the aperture such that an amount of stress, caused by the optical contact bond (e.g., at L1, L2, and L3), in the transmissive optical element E2 at the aperture is minimized In an embodiment, the selected locations are at least three raised portions of the substrate E11, the raised portions forming a raised surface RS. The raised surface RS forming the optical contact bond (e.g., at L1, L2, and L3) with the transmissive optical element E2 and constraining the transmissive optical element E2 in a plane of the raised surface RS.

In an embodiment, the raised surface RS creates a gap between the transmissive optical element E2 and a depressed surface DS surrounding. The raised surface RS of the substrate E11, the gap preventing the transmissive optical element E2 from creating an optical contact bond (e.g., at L1, L2, and L3) with the depressed surface DS or naturally joining the depressed surface DS of the substrate E11.

In an embodiment, a thickness of the substrate E11 is between 1 mm to 4 mm, and a thickness of the transmissive optical element E2 is 0.5 mm or less.

In an embodiment, the optical contact bond (e.g., at L1, L2, and L3) are spaced from the aperture such that the transmissive optical element E2 is constrained in six degrees of freedom.

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

- a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.

a programmable LCD array. An example of such a construction is given in U.S. Pat. No. 5,229,872, which is incorporated herein by reference.

As a brief introduction, FIG. 7 illustrates an exemplary lithographic projection apparatus 10A. Major components are a radiation source 12A, which may be a deep-ultraviolet excimer laser source or other type of source including an extreme ultra violet (EUV) source (as discussed above, the lithographic projection apparatus itself need not have the radiation source), illumination optics which define the partial coherence (denoted as sigma) and which may include optics 14A, 16Aa and 16Ab that shape radiation from the source 12A; a patterning device 14A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics NA=sin ($\Theta_{max}$).

In an optimization process of a system, a figure of merit of the system can be represented as a cost function. The optimization process boils down to a process of finding a set of parameters (design variables) of the system that minimizes the cost function. The cost function can have any suitable form depending on the goal of the optimization. For example, the cost function can be weighted root mean square (RMS) of deviations of certain characteristics (evaluation points) of the system with respect to the intended values (e.g., ideal values) of these characteristics; the cost function can also be the maximum of these deviations (i.e., worst deviation). The term "evaluation points" herein should be interpreted broadly to include any characteristics of the system. The design variables of the system can be confined to finite ranges and/or be interdependent due to practicalities of implementations of the system. In case of a lithographic projection apparatus, the constraints are often associated with physical properties and characteristics of the hardware such as tunable ranges, and/or patterning device manufacturability design rules, and the evaluation points can include physical points on a resist image on a substrate, as well as non-physical characteristics such as dose and focus.

In a lithographic projection apparatus, a source provides illumination (i.e. light); projection optics direct and shapes the illumination via a patterning device and onto a substrate. The term "projection optics" is broadly defined here to include any optical component that may alter the wavefront of the radiation beam. For example, projection optics may include at least some of the components 14A, 16Aa, 16Ab and 16Ac. An aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in commonly assigned U.S. patent application Ser. No. 12/315,849, disclosure of which is hereby incorporated by reference in its entirety. The resist model is related only to properties of the resist layer (e.g., effects of chemical processes which occur during exposure, PEB and development). Optical properties of the lithographic projection apparatus (e.g., properties of the source, the patterning device and the projection optics) dictate the aerial image. Since the patterning device used in the lithographic projection apparatus can be changed, it is desirable to separate the optical properties of the patterning device from the optical properties of the rest of the lithographic projection apparatus including at least the source and the projection optics.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

Further, the lithographic projection apparatus may be of a type having two or more substrate tables (and/or two or more patterning device tables). In such "multiple stage" devices the additional tables may be used in parallel, or preparatory steps may be carried out on one or more tables while one or more other tables are being used for exposures. Twin stage lithographic projection apparatuses are described, for example, in U.S. Pat. No. 5,969,441, incorporated herein by reference.

FIG. 8 schematically depicts an exemplary lithographic projection apparatus LA. The lithographic projection apparatus LA includes: a source collector module SO; an illumination system (illuminator) IL configured to condition a radiation beam B (e.g. EUV radiation); a support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be reflective (as in lithographic apparatus LA of FIG. 1) or transmissive. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus LA is of a reflective type (e.g. employing a reflective mask). It is to be noted that because most materials are absorptive within the EUV wavelength range, the mask may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 8, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 8, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as faceted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus LA could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.
2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.
3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 9:
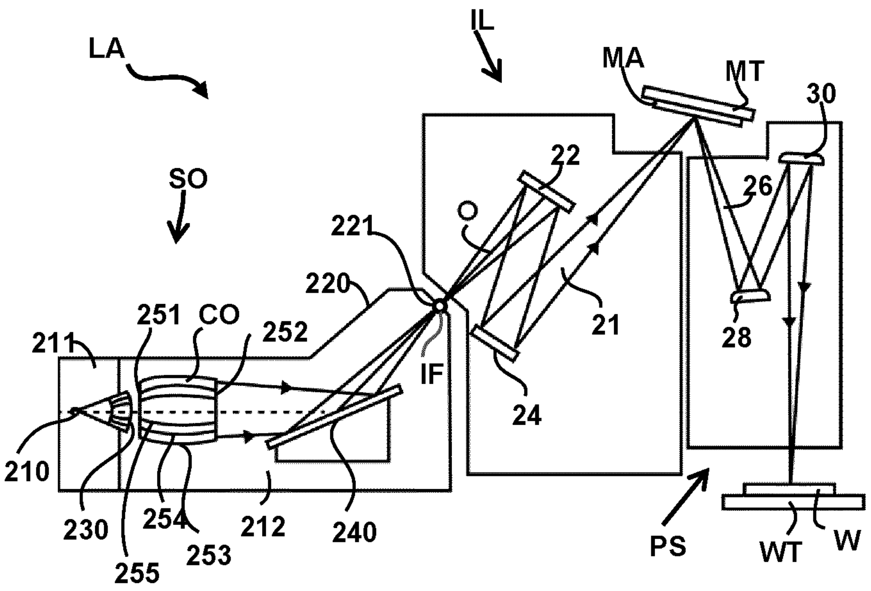
FIG. 9 is a more detailed view of the apparatus in FIG. 8, according to an embodiment.

FIG. 9 shows the apparatus LA in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 9.

Collector optic CO, as illustrated in FIG. 9, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is preferably used in combination with a discharge produced plasma source, often called a DPP source.

Figure 10:
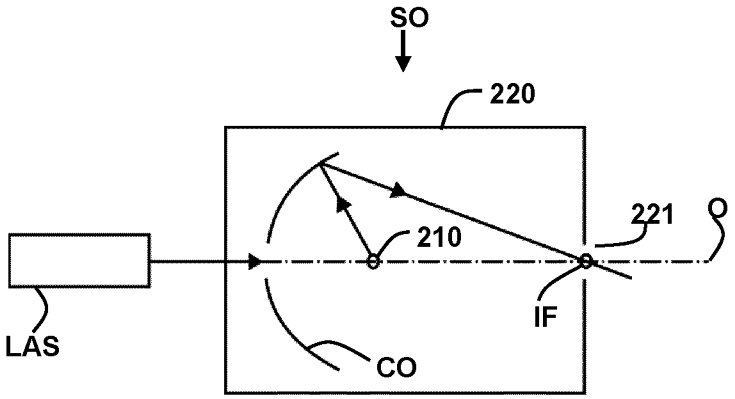
FIG. 10 is a more detailed view of the source collector module SO of the apparatus of FIGS. 8 and 9, according to an embodiment.

Alternatively, the source collector module SO may be part of an LPP radiation system as shown in FIG. 10. A laser LAS is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

Other aspects of the invention are set out in the following numbered clauses.

1. An optical apparatus comprising:
   - a substrate having an aperture for passing light;
   - a transmissive optical element covering the aperture of the substrate; and
   - an optical contact bond between the substrate and transmissive optical element, the optical contact bond being spaced from the aperture a sufficient distance such that stress forces in the transmissive optical element from the optical contact bond to the aperture are below an acceptable stress threshold.
2. The optical apparatus of clause 1, wherein the optical contact bond is formed at a selected locations of the substrate, wherein a distance of a selected location from the aperture is a function of stress, caused by the optical contact bond, in the transmissive optical element.
3. The optical apparatus of clause 2, wherein one or more locations of the selected locations are spaced farthest from the aperture such that an amount of stress, caused by the optical contact bond, in the transmissive optical element at the aperture is minimized.
4. The optical apparatus of clause 3, wherein the selected locations are at least three raised portions of the substrate, the raised portions forming a raised surface, the raised surface forming the optical contact bond with the transmissive optical element and constraining the transmissive optical element in a plane of the raised surface.
5. The optical apparatus of clause 4, wherein the raised surface creates a gap between the transmissive optical element and a depressed surface surrounding the raised surface of the substrate, the gap preventing the transmissive optical element from creating an optical contact bond with the depressed surface or naturally joining the depressed surface of the substrate.
6. The optical apparatus of clause 5, wherein the depressed surface of the substrate is relatively rougher than the raised surface of the substrate.
7. The optical apparatus of clause 6, wherein the depressed surface of the substrate is sandblasted.
8. The optical apparatus of any of clauses 5-7, wherein the depressed surface is created by masking the selected locations and acid-etching the substrate, the masking reducing an area of the raised surface of the selected locations such that the stress caused from contacting is reduced compared to stress at the depressed surface.
9. The optical apparatus of any of clauses 6-8, wherein a surface roughness of both the transmissive optical element and the substrate is less than 5 nm at portions forming the optical contact bond.
10. The optical apparatus of any of clauses 1-9, wherein the aperture is a rectangular cut-out in the substrate.
11. The optical apparatus of any of clauses 1-10, wherein a thickness of the substrate is greater than a thickness of the transmissive optical element.
12. The optical apparatus of clause 11, wherein the thickness of the substrate is between 1 mm to 4 mm, and the thickness of the transmissive optical element is 0.5 mm or less.
13. The optical apparatus of any of clauses 1-12, wherein the optical contact bond are spaced from the aperture such that the transmissive optical element is constrained in six degrees of freedom.
14. The optical apparatus of clause 13, wherein the six degrees of freedom comprises:

three translation directions along x-axis, y-axis, and z-axis, respectively, and three rotational directions about x-axis, y-axis, and z-axis, respectively.

15. The optical apparatus of any of clauses 1-14, wherein the optical contact bond is a glueless bond between two closely conformal surfaces being joined together and being held purely by intermolecular forces.

16. The optical apparatus of any of clauses 1-15, wherein the acceptable stress threshold is associated with an optical property of the transmissive optical element affected by the stress at the aperture.

17. The optical apparatus of any of clauses 1-16, wherein the optical contact bond at the selected locations minimizes a birefringence effect caused by the light passing through the aperture and the transmissive optical element.

18. The optical apparatus of clause 17, wherein the birefringence effect is an optical path difference (OPD) of the light used to create a topographic map of the substrate.

19. A metrology apparatus for measuring a characteristic of an object comprising:

a light source; and an optical apparatus comprising:

a substrate having an aperture for passing light;

a transmissive optical element covering the aperture of the substrate; and an optical contact bond between the substrate and transmissive optical element, the optical contact bond being spaced from the aperture a sufficient distance such that stress forces in the transmissive optical element from the optical contact bond to the aperture are below an acceptable stress threshold, wherein the light passing through the transmissive optical element generates an interference pattern, which is used to extract a measurement of the characteristic of the object.

20. The metrology apparatus of clause 19, wherein the characteristic is a height map of the object measured based on the interference pattern generating via reflecting the light of the object and passing the reflected light through the optical apparatus.

21. The metrology apparatus of clause 20, wherein the object is a wafer imaged by a lithographic apparatus.

22. The metrology apparatus of clause 21, wherein the characteristic of the object is alignment data associated with a pattern printed on the wafer imaged by the lithographic apparatus.

23. The metrology apparatus of clause 19, wherein the optical contact bond is formed at a selected locations of the substrate, wherein a distance of a selected location from the aperture is a function of stress, caused by the optical contact bond, in the transmissive optical element.

24. The metrology apparatus of clause 22, wherein one or more locations of the selected locations are spaced farthest from the aperture such that an amount of stress, caused by the optical contact bond, in the transmissive optical element at the aperture is minimized.

25. The metrology apparatus of clause 23, wherein the selected locations are at least three raised portions of the substrate, the raised portions forming a raised surface, the raised surface forming the optical contact bond with the transmissive optical element and constraining the transmissive optical element in a plane of the raised surface.

26. The metrology apparatus of clause 24, wherein the raised surface creates a gap between the transmissive optical element and a depressed surface surrounding the raised surface of the substrate, the gap preventing the transmissive optical element from creating an optical contact bond with the depressed surface or naturally joining the depressed surface of the substrate.

27. The metrology apparatus of any of clauses 19-26, wherein a thickness of the substrate is between 1 mm to 4 mm, and a thickness of the transmissive optical element is 0.5 mm or less.

28. The metrology apparatus of any of clauses 19-27, wherein the optical contact bond are spaced from the aperture such that the transmissive optical element is constrained in six degrees of freedom.

29. The metrology apparatus of clause 28, wherein the optical contact bond is formed such that an optical path difference (OPD) of the light used to create a topographic map of the substrate.

30. A lithographic apparatus comprising:

a light source; and an optical apparatus comprising:

a substrate having an aperture for passing light;

a transmissive optical element covering the aperture of the substrate; and an optical contact bond between the substrate and transmissive optical element, the optical contact bond being spaced from the aperture a sufficient distance such that stress forces in the transmissive optical element from the optical contact bond to the aperture are below an acceptable stress threshold, wherein the light passing through the transmissive optical element generates an interference pattern, which is used to extract a measurement of a characteristic associated with a patterning process.

31. The lithographic apparatus of clause 30, wherein the characteristic is a height map of an object being patterned by the lithographic apparatus, wherein the characteristic is derived based on the interference pattern generated by reflecting the light of the object and passing the reflected light through the optical apparatus.

32. The lithographic apparatus of clause 31, wherein the characteristic is alignment data, wherein the alignment data is indicative of alignment between patterns on a particular layer or between different layers of the object patterned via the lithographic apparatus.

33. The lithographic apparatus of any of clauses 30-32, wherein the optical contact bond is formed at a selected locations of the substrate, wherein a distance of a selected location from the aperture is a function of stress, caused by the optical contact bond, in the transmissive optical element.

34. The lithographic apparatus of clause 33, wherein one or more locations of the selected locations are spaced farthest from the aperture such that an amount of stress, caused by the optical contact bond, in the transmissive optical element at the aperture is minimized.

35. The lithographic apparatus of clause 34, wherein the selected locations are at least three raised portions of the substrate, the raised portions forming a raised surface, the raised surface forming the optical contact bond with the transmissive optical element and constraining the transmissive optical element in a plane of the raised surface.

36. The lithographic apparatus of clause 31, wherein the raised surface creates a gap between the transmissive optical element and a depressed surface surrounding the raised surface of the substrate, the gap preventing the transmissive optical element from creating an optical contact bond with the depressed surface or naturally joining the depressed surface of the substrate.

37. The lithographic apparatus of any of clauses 30-36, wherein a thickness of the substrate is between 1 mm to 4 mm, and a thickness of the transmissive optical element is 0.5 mm or less.

38. The lithographic apparatus of any of clauses 30-37, wherein the optical contact bond are spaced from the aperture such that the transmissive optical element is constrained in six degrees of freedom.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

The invention claimed is:

1. An optical apparatus comprising:

a substrate having an aperture for passing light;

a transmissive optical element covering the aperture of the substrate; and an optical contact bond between the substrate and transmissive optical element, the optical contact bond being spaced from the aperture a sufficient distance such that stress forces in the transmissive optical element from the optical contact bond to the aperture are below an acceptable stress threshold, wherein the optical contact bond is formed at three or more raised portions of the substrate having areas less than an area of interface between the substrate and the transmissive optical element, the raised portions defining a raised surface and the raised surface forming the optical contact bond with the transmissive optical element and constraining the transmissive optical element in a plane of the raised surface.

2. The optical apparatus of claim 1, wherein one or more locations of the selected locations are spaced farthest from the aperture such that an amount of stress, caused by the optical contact bond, in the transmissive optical element at the aperture is minimized.

3. The optical apparatus of claim 1, wherein the raised surface creates a gap between the transmissive optical element and a depressed surface surrounding the raised surface of the substrate, the gap preventing the transmissive optical element from creating an optical contact bond with the depressed surface or naturally joining the depressed surface of the substrate.

4. The optical apparatus of claim 3, wherein the depressed surface of the substrate is relatively rougher than the raised surface of the substrate.

5. The optical apparatus of claim 4, wherein the depressed surface of the substrate is sandblasted.

6. The optical apparatus of claim 3, wherein the depressed surface is created by masking the selected locations and acid-etching the substrate, the masking reducing an area of the raised surface of the selected locations such that the stress caused from contacting is reduced compared to stress at the depressed surface.

7. The optical apparatus of claim 4, wherein a surface roughness of both the transmissive optical element and the substrate is less than 5 nm at portions forming the optical contact bond.

8. The optical apparatus of claim 1, wherein the aperture is a rectangular cut-out in the substrate.

9. The optical apparatus of claim 1, wherein a thickness of the substrate is greater than a thickness of the transmissive optical element.

10. The optical apparatus of claim 9, wherein the thickness of the substrate is between 1 mm to 4 mm, and the thickness of the transmissive optical element is 0.5 mm or less.

11. The optical apparatus of claim 1, wherein the optical contact bond is spaced from the aperture such that the transmissive optical element is constrained in six degrees of freedom.

12. The optical apparatus of claim 11, wherein the six degrees of freedom comprises:

three translation directions along x-axis, y-axis, and z-axis, respectively, and three rotational directions about x-axis, y-axis, and z-axis, respectively.

13. The optical apparatus of claim 1, wherein the optical contact bond is a glueless bond between two closely conformal surfaces being joined together and being held purely by intermolecular forces.

14. The optical apparatus of claim 1, wherein the acceptable stress threshold is associated with an optical property of the transmissive optical element affected by the stress at the aperture.

15. The optical apparatus of claim 1, wherein the optical contact bond at the selected locations minimizes a birefringence effect caused by the light passing through the aperture and the transmissive optical element.

16. The optical apparatus of claim 15, wherein the birefringence effect is an optical path difference (OPD) of the light used to create a topographic map of the substrate.

17. A metrology apparatus comprising:

a light source; and an optical apparatus comprising:

a substrate having an aperture for passing light;

a transmissive optical element covering the aperture of the substrate; and an optical contact bond between the substrate and transmissive optical element, the optical contact bond being spaced from the aperture a sufficient distance such that stress forces in the transmissive optical element from the optical contact bond to the aperture are below an acceptable stress threshold, wherein the optical contact bond is formed at three or more raised portions of the substrate having areas less than an area of interface between the substrate and the transmissive optical element, the raised portions defining a raised surface and the raised surface forming the optical contact bond with the transmissive optical element and constraining the transmissive optical element in a plane of the raised surface, and wherein light passing through the transmissive optical element generates an interference pattern, which is used to extract a measurement of a characteristic of an object.

18. The metrology apparatus of claim 17, wherein the raised surface creates an open gap between the transmissive optical element and a depressed surface surrounding the raised surface of the substrate, the gap preventing the transmissive optical element from creating an optical contact bond with the depressed surface or naturally joining the depressed surface of the substrate.

19. A lithographic apparatus comprising:

a light source; and an optical apparatus comprising:

a substrate having an aperture for passing light;

a transmissive optical element covering the aperture of the substrate; and an optical contact bond between the substrate and transmissive optical element, the optical contact bond being spaced from the aperture a sufficient distance such that stress forces in the transmissive optical element from the optical contact bond to the aperture are below an acceptable stress threshold, wherein the optical contact bond is formed at three or more raised portions of the substrate having areas less than an area of interface between the substrate and the transmissive optical element, the raised portions defining a raised surface and the raised surface forming the optical contact bond with the transmissive optical element and constraining the transmissive optical element in a plane of the raised surface, and wherein the light passing through the transmissive optical element generates an interference pattern, which is used to extract a measurement of a characteristic associated with a patterning process.

20. The lithographic apparatus of claim 19, wherein the raised surface creates an open gap between the transmissive optical element and a depressed surface surrounding the raised surface of the substrate, the gap preventing the transmissive optical element from creating an optical contact bond with the depressed surface or naturally joining the depressed surface of the substrate.

* * * * *